United States Patent
Park

(10) Patent No.: US 6,535,457 B1
(45) Date of Patent: Mar. 18, 2003

(54) SEMICONDUCTOR MEMORY DEVICE HAVING CLOCK GENERATOR FOR CONTROLLING MEMORY AND METHOD OF GENERATING CLOCK SIGNAL

(75) Inventor: Jae-hyun Park, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/194,103

(22) Filed: Jul. 12, 2002

(30) Foreign Application Priority Data

Sep. 27, 2001 (KR) .............................. 01-60024

(51) Int. Cl.$^7$ ................ G11C 8/00; G11C 7/00
(52) U.S. Cl. .............. 365/233; 365/189.07; 365/194; 365/236
(58) Field of Search ............ 365/233, 189.07, 365/194, 236

(56) References Cited

U.S. PATENT DOCUMENTS 5,825,706 A * 10/1998 Snowden et al. ........... 365/222
6,219,797 B1 * 4/2001 Liu et al. .................... 713/500

* cited by examiner

Primary Examiner—Son T. Dinh
(74) Attorney, Agent, or Firm—Mills & Onello LLP

(57) ABSTRACT

A semiconductor memory device having a clock generator for controlling a memory and a method of generating a clock are provided. The semiconductor memory device includes a processor, a program memory unit, and a clock generator. The processor generates control signals for controlling a program memory unit in response to a system clock, receives an instruction from the program memory unit, and is reset in response to a reset signal. The program memory unit receives the control signals and generates the instruction in response to a clock signal. The clock generator receives the control signals and the instruction in response to the system clock and generates the clock signal for controlling the program memory unit and the reset signal for resetting the processor. In the semiconductor memory device having a clock generator for controlling a memory and the method of generating a clock, the speed for reading an instruction of a program memory unit is prevented from being inaccurate due to a change in conditions for a process and the inaccuracy of simulation. Also, the delay of a system clock for controlling the program memory unit is automatically controlled. Thus, the speed for reading the instruction of the program memory unit is optimized.

10 Claims, 6 Drawing Sheets

SEMICONDUCTOR MEMORY DEVICE HAVING CLOCK GENERATOR FOR CONTROLLING MEMORY AND METHOD OF GENERATING CLOCK SIGNAL

BACKGROUND OF THE INVENTION

1. Field of the Invention

The present invention relates to a clock generator, and more particularly, to a clock generator for controlling memory and a method of generating a clock signal.

2. Description of the Related Art

Similar to signal processing application products including modems and the like, in a semiconductor chip having a program memory therein, a signal processor must output an instruction stored in the program memory within a clock cycle of a system clock. However, errors occur in the timing of control signals input from the signal processor to the program memory if conditions for a process are changed or simulation for circuits in the semiconductor chip are not accurate. As a result, errors may occur when the instruction of the program memory is read.

FIG. 1 is a block diagram of a signal processing semiconductor chip having a conventional program memory. The signal processing semiconductor chip 100 includes a processor 110 and a program memory unit 120. Here, the processor 110 is a signal processor, and in particular, a digital signal processor (DSP). In general, memory is classified into memory for storing data and memory for storing instructions, i.e., a code signal. Here, the program memory unit 120 is memory for storing an instructions.

The processor 110 transmits control signals CSN, OEN, and ADD to the program memory unit 120 in response to a system clock SYSCLK and reads an instruction DO stored in the program memory unit 120. The control signals CSN, OEN, and ADD includes a chip select signal CSN, an output enabling signal OEN, and an address signal ADD.

FIG. 2 is a timing diagram of control signals output from the processor 110 shown in FIG. 1. Referring to FIGS. 1 and 2, the processor 110 outputs the control signals CSN, OEN, and ADD in response to the system clock SYSCLK. FIG. 2 shows the timing relationship between the address signal ADD and the output enabling signal OEN.

The address signal ADD is delayed by a predetermined time tD in response to a rising edge of the system clock SYSCLK. The output enabling signal OEN is also delayed by a delay time tD since it is simultaneously generated with the address signal ADD. Delay time for the control signals OEN and ADD increases if the control signals OEN and ADD that are delayed are applied to the program memory unit 120.

FIG. 3 is a timing diagram of the control signals of FIG. 1 applied to the program memory unit 120. Referring to FIG. 3, timing of the system clock SYSCLK is controlled by delaying the system clock SYSCLK so that the rising edge of the system clock SYSCLK recognizes the address signal ADD. That is, the system clock SYSCLK is delayed so that the program memory unit 120 operates without errors. Thus, the address signal ADD has an operational margin by an operational margin time tAD.

FIG. 4 is a timing diagram showing the operation of the program memory unit 120 shown in FIG. 1. Referring to FIG. 4, the system clock SYSCLK is sufficiently delayed so that the program memory unit 120 can operate properly. That is, the chip select signal CSN and the address signal ADD operate with sufficient setup time and hold time in response to the rising edge of the system clock SYSCLK. The time periods tCS and tAS both represent setup time for the rising edge of the system clock SYSCLK, and tCH and tAH both represent hold time for the rising edge of the system clock SYSCLK. The program memory unit 120 generates an instruction DO stored therein in response to the control signals CSN, OEN, ADD. The period tDH represents hold time for the rising edge of the system clock SYSCLK, a portion with slanted lines represents an unknown instruction, and tACC represents the time required for generating a valid instruction DO from the rising edge of the system clock SYSCLK.

The system clock SYSCLK must be delayed by the sum of the delay time tD of FIG. 2 and the operational margin time tAD of FIG. 3 in order to normally operate the program memory unit 120 as shown in FIG. 4. The time required for delaying the system clock SYSCLK depends on a simulation. Thus, the time required for delaying the system clock SYSCLK is inaccurate if the simulation is inaccurate. As a result, errors may occur when the instruction is read from the program memory unit 120.

SUMMARY OF THE INVENTION

To solve the above-described problems, it is a first object of the present invention to provide a semiconductor memory device in which the delay of a system clock for controlling a program memory is automatically controlled to optimize the speed for reading the program memory.

It is a second object of the present invention to provide a method of optimizing the speed for reading a program memory by automatically controlling the delay of a system clock for controlling the program memory.

In accordance with the invention, there is provided a semiconductor memory device including a processor, a program memory unit, and a clock generator. The processor generates control signals for controlling the program memory unit in response to a system clock, receives an instruction from the program memory unit, and is reset in response to a reset signal. The program memory unit receives the control signals and generates the instruction in response to a clock signal. The clock generator receives the control signals and the instruction in response to the system clock and generates the clock signal for controlling the program memory unit and the reset signal for resetting the processor.

In one embodiment, the clock generator includes a mirror memory, a comparator, a counter, a delayer, and a reset delayer. The mirror memory receives the control signals and generates a mirror instruction in response to the clock signal. The comparator is reset in response to the reset signal, compares the mirror instruction with the instruction in response to the system clock, outputs a comparison reset signal at a first logic level if the mirror instruction and the instruction have different phases, and outputs the comparison reset signal at a second logic level if the mirror instruction and the instruction have the same phase. The counter receives the comparison reset signal and increases an output value if the comparison reset signal is at the first logic level. The delayer delays the system clock and outputs it as the clock signal in response to the output value of the counter. The reset delayer receives the comparison reset signal in response to the system clock and generates the reset signal if the comparison reset signal is at the first logic level.

In accordance with another aspect of the invention, there is provided a method of generating a clock signal for controlling a program memory unit in a semiconductor memory device which uses the program memory unit to store an instruction and a processor for generating control signals for controlling the program memory unit. The method includes: (a) generating control signals for controlling the program memory unit in response to a system clock; (b) receiving the control signals and generating the instruction in response to a predetermined clock signal; (c) receiving the control signals and the instruction in response to the system clock and generating the clock signal for controlling the program memory unit and a reset signal for resetting the processor; and (d) receiving the instruction, resetting the processor in response to the reset signal, and going back to step (a) to continue the method.

As described, in a semiconductor memory device having a clock generator according to the present invention and a method of generating a clock, the speed for reading an instruction of a program memory unit is prevented from being inaccurate due to a change in conditions for a process and the inaccuracy of simulation. Also, the delay of a system clock for controlling the program memory unit is automatically controlled. Thus, the speed for reading the instruction of the program memory unit is optimized.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
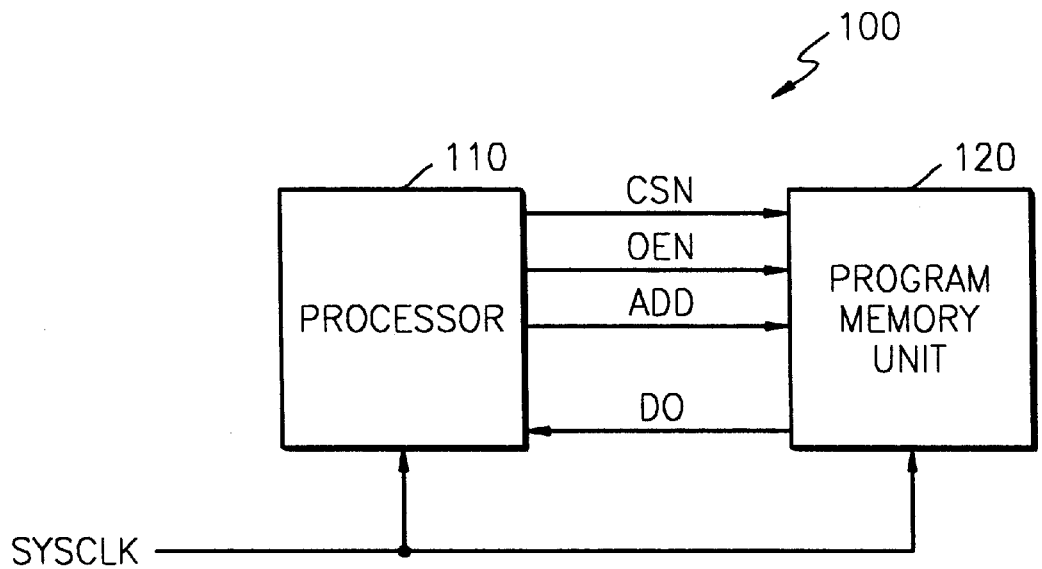
FIG. 1 is a block diagram of a semiconductor chip having a conventional program memory stored therein.
Figure 2:
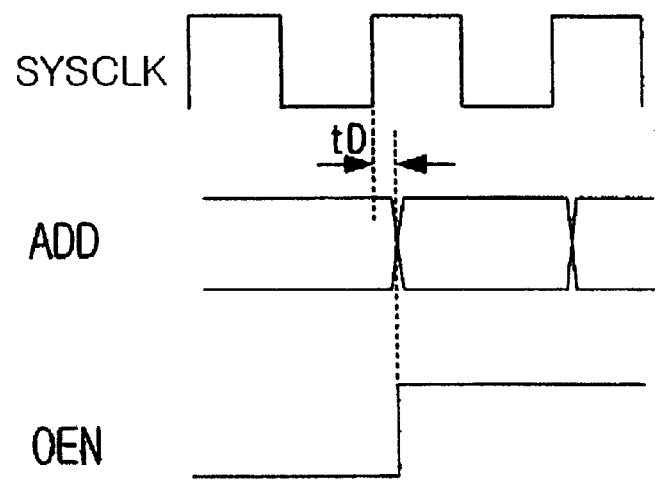
FIG. 2 is a timing diagram of control signals output from a processor shown in FIG. 1.
Figure 3:
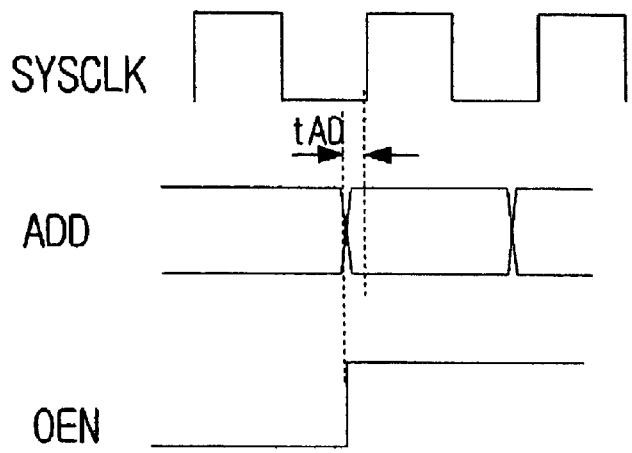
FIG. 3 is a timing diagram of the control signals of FIG. 2 applied to a program memory unit.
Figure 4:
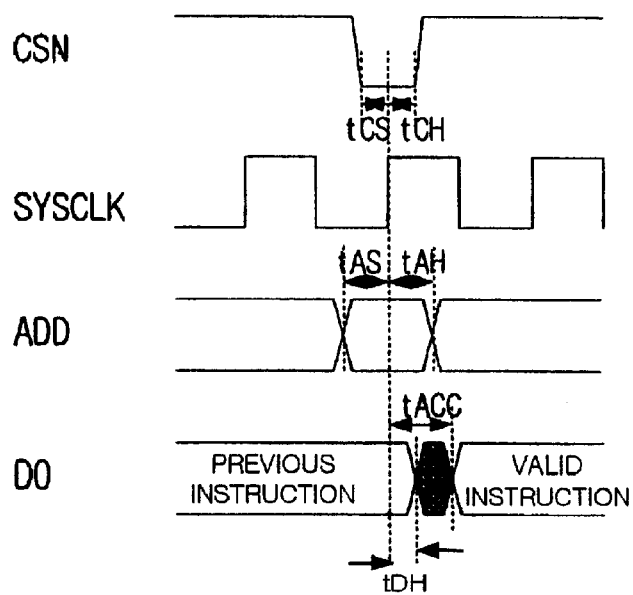
FIG. 4 is a timing diagram showing the operation of the program memory unit shown in FIG. 1.
Figure 5:
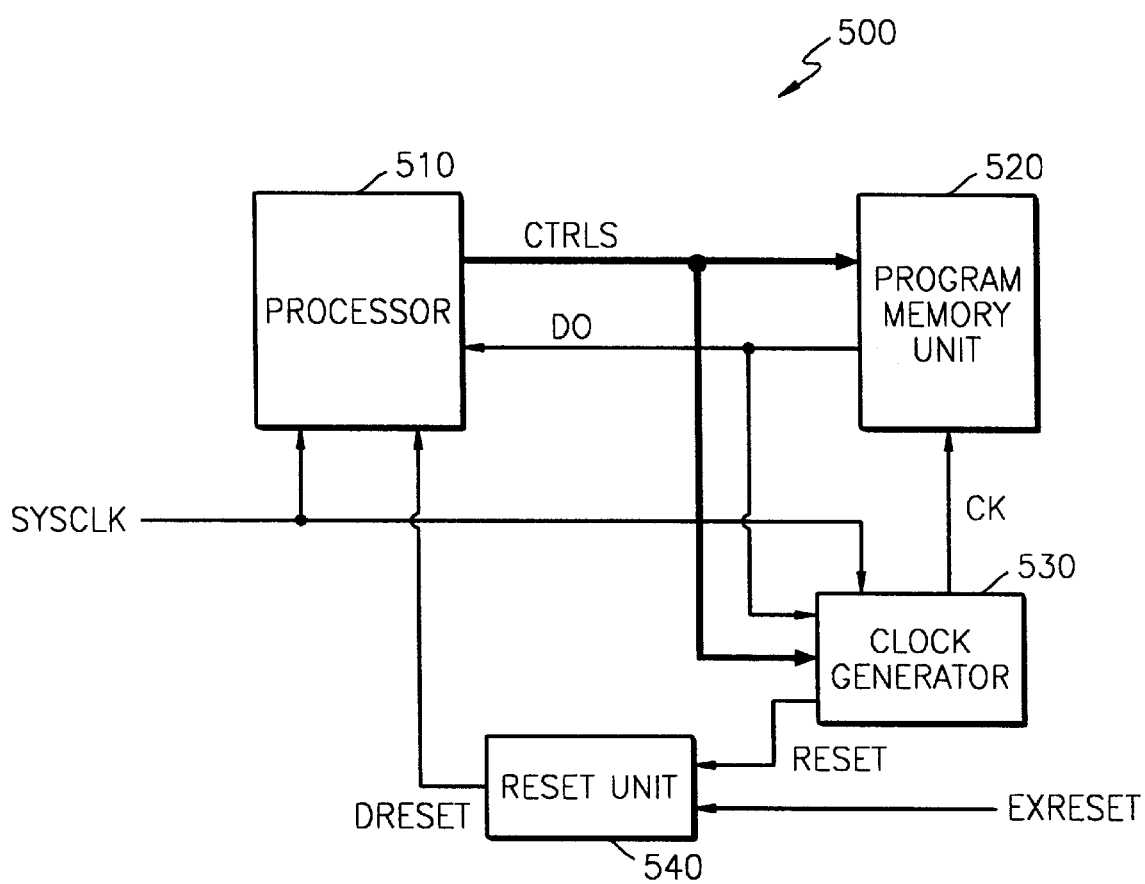
FIG. 5 is a block diagram of a semiconductor memory device according to one embodiment of the present invention.

FIG. 5 is a block diagram of a semiconductor memory device according to one embodiment of the present invention. Referring to FIG. 5, a semiconductor memory device 500 according to the present invention includes a processor 510, a program memory unit 520, and a clock generator 530.

The processor 510 generates control signals CTRLS for controlling the program memory unit 520 in response to a system clock SYSCLK, receives an instruction DO from the program memory unit 520, and is reset in response to a predetermined reset signal RESET. Here, the processor 510 is a signal processor, and in particular, a digital signal processor. The control signals CTRS include a chip select signal, an output enabling signal, and an address signal.

The program memory unit 520 receives the control signals CTRLS and generates the instruction DO in response to a clock signal CK. The program memory unit 520 stores instructions, i.e., code signals, not general data. The program memory unit 520 is a synchronous memory, which operates in response to the clock signal CK.

The clock generator 530 receives the control signals CTRLS and the instruction DO in response to the system clock SYSCLK and generates the clock signal CK for controlling the program memory unit 520 and the reset signal RESET for resetting the processor 510.

Hereinafter, the operation of the semiconductor memory device 500 having a clock generator according to an embodiment of the present invention and a method of generating a clock will be described in detail with reference to FIG. 5.

The processor 510 applies the control signals CTRLS to the program memory unit 520 and the clock generator 530. The program memory unit 520 applies the instruction DO to the processor 510 in response to the clock signal CK output from the clock generator 530. The clock generator 530 receives the system clock SYSCLK to output the clock signal CK generated by delaying the system clock SYSCLK so that the program memory unit 520 receives the control signals CTRLS and stably outputs the instruction DO for one cycle of the system clock SYSCLK. The clock generator 530 generates the reset signal RESET for resetting the processor 510. The configuration and function of the clock generator 530 will be described below in more detail with reference to FIG. 6.

Preferably, the semiconductor memory device 500 further includes a reset unit 540. The reset unit 540 receives an external reset signal EXRESET for resetting the processor 510 and the reset signal RESET, and generates a direct reset signal DRESET for resetting the processor 510 if either one of the external reset signal EXRESET and the reset signal RESET is activated. The reset unit 540 may be an AND means or an OR means based on the logic levels of the external reset signal EXRESET and the reset signal RESET. That is, the reset unit 540 may be an AND means if the reset signal RESET or the external reset signal EXRESET is logic "low". Thus, the processor 510 is reset if either one of the reset signal RESET and the external reset signal EXRESET is logic "low". The reset unit 540 may be an OR means if the reset signal RESET or the external reset signal EXRESET is logic "high". Thus, the processor 510 is reset if either one of the reset signal RESET and the external reset signal EXRESET is logic "high ". The processor 510 may be reset by the external reset signal EXRESET input into the reset unit 540 via an external reset pin (not shown), or may be reset by the reset signal RESET output from the clock generator 530.

Figure 6:
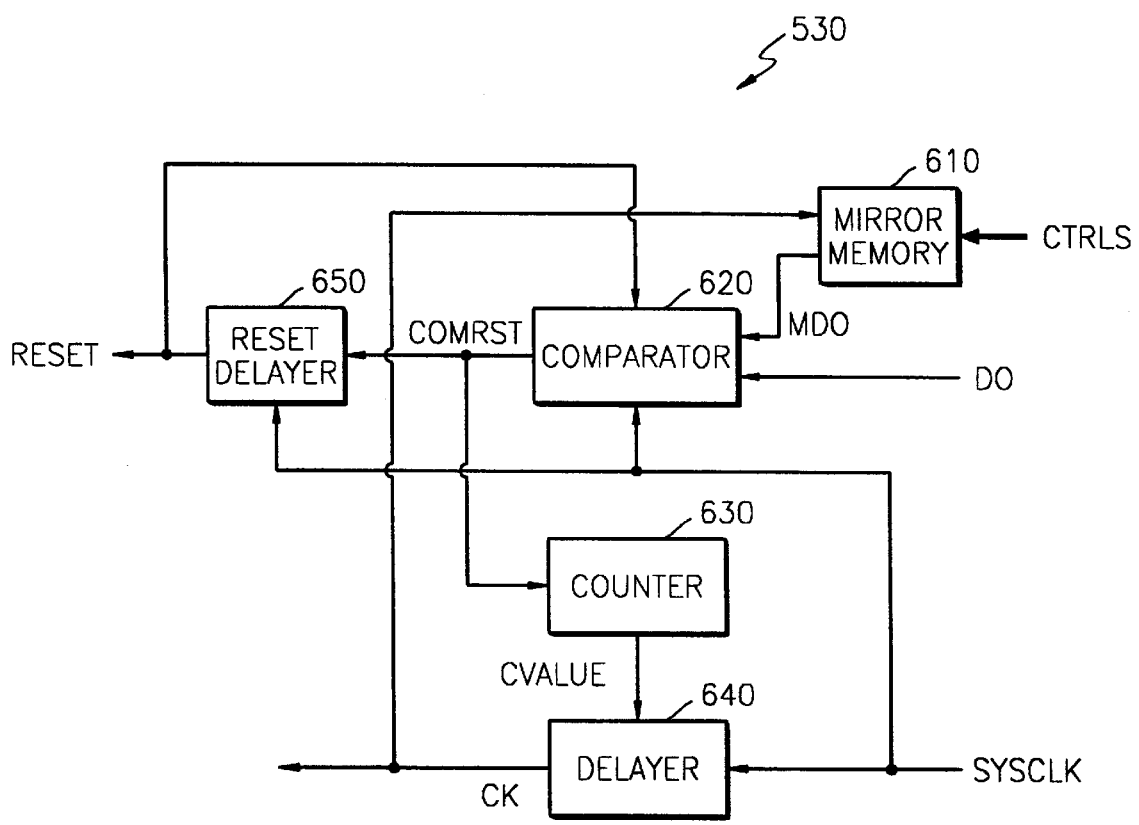
FIG. 6 is a block diagram of a clock generator shown in FIG. 5.

FIG. 6 is a block diagram of the clock generator 530 shown in FIG. 5. Referring to FIG. 6, the clock generator 530 includes a mirror memory 610, a comparator 620, a counter 630, a delayer 640, and a reset delayer 650.

The mirror memory 610 receives the control signals CTRLS and generates a mirror instruction MDO in response to the clock signal CK. The comparator 620 is reset in response to the reset signal RESET and compares the mirror instruction MDO with the instruction DO in response to the system clock SYSCLK. Next, the comparator 620 outputs a comparison reset signal COMRST as a first logic level if the mirror instruction MDO and the instruction DO have different phases or outputs the comparison reset signal COMRST as a second logic level if the mirror instruction MDO and the instruction DO have the same phases.

The counter 630 receives the comparison reset signal COMRST and increases an output value CVALUE if the comparison reset signal COMRST is at the first logic level. The delayer 640 delays the system clock SYSCLK in response to the output value CVALUE and outputs the delayed signal as the clock signal CK. The reset delayer 650 receives the comparison reset signal COMRST in response to the system clock SYSCLK and outputs the reset signal RESET for resetting the processor 530 if the comparison reset signal COMRST is at the first logic level.

Hereinafter, the operation of the clock generator 530 will be described in detail with reference to FIG. 6.

The mirror memory 610 stores a predetermined amount of the instruction DO output from the program memory unit 520 after the processor 510 is reset. That is, the mirror memory 610 stores a predetermined portion of the instruction. DO stored in the program memory unit 520 and outputs the predetermined portion of the instruction DO as the mirror instruction MDO. The size of the instruction DO stored in the mirror memory 610 is about 1% of the size of the instruction DO stored in the program memory unit 520. The mirror instruction MDO must be synchronized with the clock signal CK, which has the same phase as the instruction DO output from the program memory unit 520, and is output from the mirror memory 610 after the processor 510 is released from being reset.

If the mirror instruction MDO and the instruction DO with different phases are output, the delay time of the clock signal CK is automatically controlled by the comparator 620, the counter 630, and the delayer 640 until the mirror instruction MDO and the instruction DO with the same phases are output. The clock signal CK when the mirror instruction MDO and the instruction DO with the same phases are output is fixed, and the program memory unit 520 is synchronized with the clock signal CK and operates. The comparator 620 is reset in response to the reset signal RESET and compares the mirror instruction MDO with the instruction DO in response to the system clock SYSCLK. From the comparison result, if the mirror instruction MDO and the instruction DO have different phases, the comparator 620 signal COMRST at the first logic level. If the mirror instruction MDO and the instruction DO have the same phase, the comparator 620 outputs the comparison reset signal COMRST at the second logic level. In one embodiment, the first logic level is logic "low", and the second logic level is logic "high". Alternatively, the first logic level may be logic "high", and the second logic level may be logic "low". However, for descriptive convenience, the first logic level is logic "low", and the second logic level is logic "high". The comparison reset signal COMRST is applied to the reset delayer 650 and the counter 630.

Figure 7:
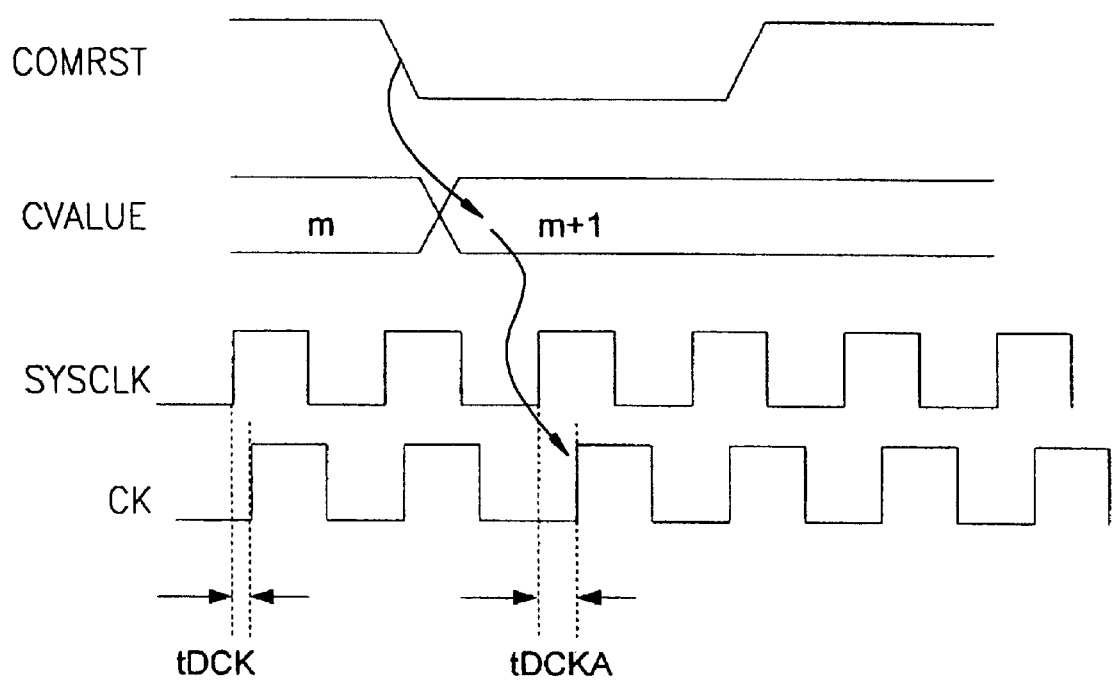
FIG. 7 is a timing diagram of a clock signal delayed by a counter shown in FIG. 6.

FIG. 7 is a timing diagram showing the clock signal CK delayed by the counter 630 shown in FIG. 6. Referring to FIGS. 6 and 7, the counter 630, which receives the comparison reset signal COMRST, increases the output value CVALUE by one if the comparison reset signal COMRST is logic "low". That is, the output value CVALUE increases from m to m+1 in response to the falling edge of the comparison reset signal COMRST. Here, m is a natural number above 1. From FIG. 7, it can be seen that the delay time tDCKA of the clock signal CK when the output value CVALUE of the counter 630 is m+1 is longer than the delay time tDCK of the clock signal CK when the output value CVALUE of the counter 630 is m.

Figure 8:
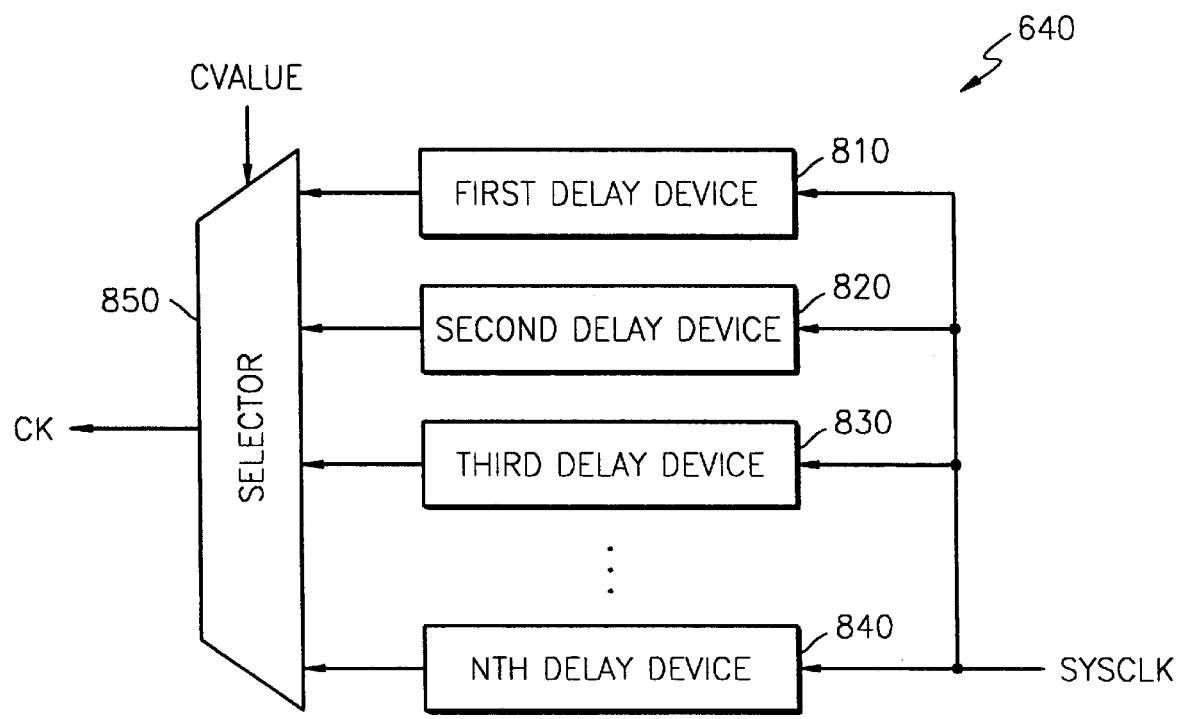
FIG. 8 is a block diagram of a delayer shown in FIG. 6.

FIG. 8 is a block diagram of the delayer 640 shown in FIG. 6. The delayer 640 includes first through Nth (N is an integer above 2) delay devices 810, 820, 830, . . . , 840 connected to each other in parallel and a selector 850. The first through Nth delay devices 810, 820, 830, . . . , 840 receive the system clock SYSCLK, delay the system clock SYSCLK by a predetermined amount of time, and output the system clock SYSCLK. The selector 850 selects one of the signals output from the first through Nth delay devices 810, 820, 830, . . . , 840 to output as the clock signal CK in response to the output value CVALUE of the counter 630. The selector 850 may be a multiplexer. In one embodiment, the delay time of the second delay device 820 is two times the delay time of the first delay device 810, the delay time of the third delay device 830 is three times the delay time of the first delay device 810, and the delay time of Nth delay device 840 is N times the delay time of the first delay device 810.

The selector 850 selects a signal output from the second delay device 820 to output as the clock signal CK if the output value CVALUE of the counter 630 is m. Then, the selector 850 selects a signal output from the third delay device 830 to output the signal as the clock signal CK if the output value CVALUE of the counter 630 is m+1. Thus, the difference in the delay times of the delay devices 810, 820, 830, . . . , 840 represents the accuracy of the time required for delaying the clock signal CK.

Figure 9:
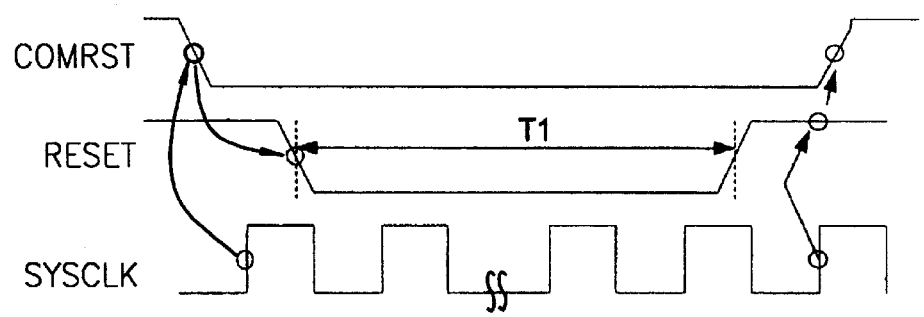
FIG. 9 is a timing diagram showing the operation of a reset delayer shown in FIG. 6.

FIG. 9 is a timing diagram showing the operation of the reset delayer 650 shown in FIG. 6. The reset delayer 650 receives the comparison reset signal COMRST in response to the system clock SYSCLK and outputs the reset signal RESET for resetting the processor 530 if the comparison reset signal COMRST is at the first logic level. Here, the first logic level may be logic "low" or logic "high", as described previously, but is logic "low" for descriptive convenience.

If the comparison reset signal COMRST is logic "low", i.e., the mirror instruction MDO and the instruction DO have different phases, the reset delayer 650 recognizes the falling edge of the comparison reset signal COMRST using the system clock SYSCLK and outputs the reset signal RESET to logic "low". The reset signal RESET becomes logic "low" in response to the comparison reset signal COMRST being logic "low", is automatically transitioned to logic "high" after a predetermined amount of time T1, and is released from being reset. Thus, the processor 510 is released from being reset. The comparison reset signal COMRST is output as logic "high" if the reset signal RESET is output as logic "high", the processor is released from being reset, and the system clock SYSCLK recognizes that the reset signal RESET is logic "high".

The processor 510 reapplies the control signals CTRLS to the program memory unit 520 and the clock generator 530 if the processor 510 is released from being reset. The clock generator 530 carries out the operation described with reference to FIG. 6 again to prolong the delay time of the clock signal CK. Due to such operation, if the phases of the mirror instruction MDO and the instruction DO become identical, the comparator 620 is locked and no longer compares the mirror instruction MDO with the instruction DO. Thus, the comparator fixes the comparison reset signal COMRST to logic "high". The counter 630 does not increase the output value CVALUE in response to the comparison reset signal COMRST, and the delayer 640 fixes the delay time of the clock signal CK. The fixed clock signal CK is applied to the program memory unit 520, and the program memory unit 520 can output the instruction DO at an optimum speed in response to the control signals CTRLS output from the processor 510 and is synchronized with the system clock SYSCLK to operate.

As describe above, in a semiconductor memory device having a clock generator according to the present invention and a method of generating a clock, the speed for reading an instruction of a program memory unit is prevented from being inaccurate due to a change in conditions for a process and the inaccuracy of simulation. Also, the delay of a system clock for controlling the program memory unit is automatically controlled. Thus, the speed for reading the instruction of the program memory unit is optimized.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:
    a program memory unit;
    a processor for generating control signals for controlling the program memory unit in response to a system clock, receiving an instruction from the program memory unit, and being reset in response to a reset signal, the program memory unit receiving the control signals and generating the instruction in response to a clock signal; and
    a clock generator for receiving the control signals and the instruction in response to the system clock and generating the clock signal for controlling the program memory unit and the reset signal for resetting the processor.

2. The semiconductor memory device of claim 1, wherein the clock generator comprises:
    a mirror memory for receiving the control signals and generating a mirror instruction in response to the clock signal;
    a comparator for being reset in response to the reset signal, comparing the mirror instruction with the instruction in response to the system clock, outputting a comparison reset signal at a first logic level if the mirror instruction and the instruction have different phases, and outputting the comparison reset signal at a second logic level if the mirror instruction and the instruction have the same phase;
    a counter for receiving the comparison reset signal and increasing an output value if the comparison reset signal is at the first logic level;
    a delayer for delaying the system clock and outputting the delayed system clock as the clock signal in response to the output value of the counter; and
    a reset delayer for receiving the comparison reset signal in response to the system clock and generating the reset signal if the comparison reset signal is at the first logic level.

3. The semiconductor memory device of claim 2, wherein the mirror memory stores a predetermined amount of the instruction output from the program memory unit after the processor is reset.

4. The semiconductor memory device of claim 2, wherein the delayer comprises:
    first through Nth (N is an integer greater than 2) delay devices connected to each other in parallel, the first through Nth delay devices for receiving the system clock, delaying the system clock by a predetermined amount of time, and outputting the system clock; and
    a selector for selecting one of the signals output from the first through Nth delay devices and outputting the selected signal as the clock signal in response to the output value of the counter;
    wherein the delay time of the second delay device is two times the delay time of the first delay device, the delay time of the third delay device is three times the delay time of the first delay device, and the delay time of the Nth delay device is N times the delay time of the first delay device.

5. The semiconductor memory device of claim 2, wherein the reset signal is generated in response to the comparison reset signal being at the first logic level and then is automatically released from being reset after a predetermined amount of time.

6. The semiconductor memory device of claim 1, wherein the program memory unit is a synchronous memory.

7. The semiconductor memory device of claim 1, further comprising a reset unit for receiving the reset signal and an external reset signal for resetting the processor and generating a direct reset signal for resetting the processor if either one of the external reset signal and the reset signal is activated.

8. A method of generating a clock signal for controlling a program memory unit in a semiconductor memory device that uses the program memory unit to store an instruction and a processor for generating control signals for controlling the program memory unit, the method comprising:
    (a) generating control signals for controlling the program memory unit in response to a system clock;
    (b) receiving the control signals and generating the instruction in response to a predetermined clock signal;
    (c) receiving the control signals and the instruction in response to the system clock and generating the clock signal for controlling the program memory unit and a reset signal for resetting the processor; and
    (d) receiving the instruction and resetting the processor in response to the reset signal and returning to step (a) to continue the method.

9. The method of claim 8, wherein step (c) comprises:
    (c1) receiving the control signals in response to the clock signal and generating a mirror instruction;
    (c2) receiving the reset signal and comparing the mirror instruction with the instruction in response to the system clock to output the comparison reset signal at a first logic level if the mirror instruction and the instruction have different phases and at a second logic level if the mirror instruction and the instruction have the same phase;
    (c3) receiving the comparison reset signal and increasing an output value of a counter if the comparison reset signal is at the first logic level;
    (c4) delaying the system clock to output as the clock signal in response to the output value; and
    (c5) receiving the comparison reset signal in response to the system clock and generating the reset signal for resetting the processor if the comparison reset signal is at the first logic level.

10. The method of claim 9, wherein the reset signal is generated in response to the comparison reset signal being at the first logic level and is automatically released from being reset after a predetermined time.

* * * * *